(12) United States Patent
Lo et al.

(10) Patent No.: US 7,869,282 B2
(45) Date of Patent: *Jan. 11, 2011

(54) METHOD OF PROGRAMMING AND ERASING A NON-VOLATILE MEMORY ARRAY

(75) Inventors: Su-Chueh Lo, Miaoli (TW); Chun-Hsiung Hung, Hsinchu (TW); Chi-Ling Chu, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/543,830

(22) Filed: Aug. 19, 2009

(65) Prior Publication Data
US 2009/0310423 A1 Dec. 17, 2009

Related U.S. Application Data

(63) Continuation of application No. 11/777,746, filed on Jul. 13, 2007, now Pat. No. 7,599,225.

(51) Int. Cl.
*G11C 11/34* (2006.01)
(52) U.S. Cl. ............ 365/185.22; 365/218; 365/189.011
(58) Field of Classification Search ............ 365/185.22, 365/218, 189.011
See application file for complete search history.

(56) References Cited

U.S. PATENT DOCUMENTS

| 5,345,583 | A  | * | 9/1994  | Davis ........................ 714/23 |
| 6,396,741 | B1 |   | 5/2002  | Bloom et al. |
| 6,937,521 | B2 |   | 8/2005  | Avni et al. |
| 7,512,002 | B2 | * | 3/2009  | Kim ...................... 365/185.11 |
| 7,599,225 | B2 | * | 10/2009 | Loh et al. ............... 365/185.22 |

* cited by examiner

*Primary Examiner*—Son Dinh
*Assistant Examiner*—Nam Nguyen
(74) *Attorney, Agent, or Firm*—Kenta Suzue; Haynes Beffel & Wolfeld LLP

(57) ABSTRACT

A method of processing an array of non-volatile memory cells to program or erase the same, by applying a voltage to the same through a program and verify pulse application circuit. The process includes a first step of selecting a voltage to be applied. Then, the maximum number of memory cells that can be processed simultaneously is determined, based on the selected voltage and characteristics of the memory cells and the circuit. The array is divided into processing groups, each group having a number of cells less than or equal to the maximum determined number. Finally, the voltage is applied to the cells.

13 Claims, 16 Drawing Sheets

Program Sequence (1st stage program)

| 1st pulse | C1 | C2 | C3 | C4 |
| 2nd pulse | C5 | C6 | C7 | C8 |
| 3rd pulse | C9 | C10 | C11 | C12 |
| 4th pulse | C13 | C14 | C15 | C16 |
| 5th pulse | C17 | C18 | C19 | C20 |

| $V_d$ | # Cells Pgm'd |
|---|---|
| 3.5 | 8 |
| 4 | 6 |
| 4.5 | 1 |
| 5 | 0 |
| 5.5 | 0 |
| 6 | 1 |
| 6.5 | 4 |

Program Sequence (1st stage verify)

Program Sequence (2nd stage program)

$Vd = 4.0v$

Program Sequence (2nd stage verify)

Program Sequence (3rd stage program)

1st pulse [ C7    C8    C10    C13 ]
2nd pulse [ C16    C20 ]

Vd = 4.5v

Program Sequence (3rd stage verify)

Program Sequence (4th stage program)

1st pulse [ C7    C10    C13    C16 ]
2nd pulse [ C20 ]

Vd = 5.0v

Program Sequence (4th stage verify)

Program Sequence (5th - 6th stage program)

1st pulse [ C7      C13      C16      C20 ]    Vd = 5.5v
                                                Vd = 6.0v

Program Sequence (5th - 6th stage verify)

C7      C3      C16      C20

Program Sequence (7th stage program)

1st pulse [ C7      C13      C16      C20 ]    Vd = 6.5v

Program Sequence (7th stage verify)

Summary of Prior Art Program Pulse Number

| Stage | Vd | Cells need pgm | Cells pgm per pulse | Pulse number |
|---|---|---|---|---|
| 1 | 3.5 | 20 | 4 | 5 |
| 2 | 4 | 12 | 4 | 3 |
| 3 | 4.5 | 6 | 4 | 2 |
| 4 | 5 | 5 | 4 | 2 |
| 5 | 5.5 | 4 | 4 | 2 |
| 6 | 6 | 4 | 4 | 2 |
| 7 | 6.5 | 4 | 4 | 1 |

Total Pulse Number                 17
                    ↑
                 constant

FIG. 5G (Prior Art)

Program Sequence (1st stage)

1st pulse ( C1    C2    C3    C4    C5    C6    C7 )
2nd pulse ( C8    C9    C10   C11   C12   C13   C14 )
3rd pulse ( C15   C16   C17   C18   C19   C20 )

Program Sequence (2nd stage)

1st pulse ( C1    C5    C6    C7    C8    C10   C11 )
2nd pulse ( C12   C13   C16   C19   C20 )    $V_d = 4.0v$

Program Sequence (3rd stage)

1st pulse ( C7    C8    C10   C13   C16   C20 )

$V_d = 4.5v$

Program Sequence (4th stage)

1st pulse [ C7    C10    C13    C16    C20 ]

$V_d = 5.0v$

Program Sequence (5th - 7th stages)

1st pulse [ C7    C13    C16    C20 ]    $V_d = 5.5v$
$V_d = 6.0v$
$V_d = 6.5v$

FIG. 9C

Summary

| Stage | Vd | Cells to pgm | Cells pgm per pulse | Pulse number |
|---|---|---|---|---|
| 1 | 3.5 | 20 | 7 | 3 |
| 2 | 4.0 | 12 | 7 | 2 |
| 3 | 4.5 | 6 | 6 | 1 |
| 4 | 5.0 | 5 | 5 | 1 |
| 5 | 5.5 | 5 | 5 | 1 |
| 6 | 6.0 | 5 | 4 | 2 |
| 7 | 6.5 | 4 | 4 | 1 |

Total Pulses                                           11

FIG. 9D

METHOD OF PROGRAMMING AND ERASING A NON-VOLATILE MEMORY ARRAY

RELATED APPLICATIONS

This application is a continuation of co-pending application Ser. No. 11/777,746 filed on 13 Jul. 2007, which is incorporated herein by reference.

BACKGROUND OF THE INVENTION

1. Field of the Invention

The invention relates to non-volatile memory such as flash memory.

2. Description of Related Art

Non-volatile memory such as flash memory is programmed by storing electrons. In the case of re-usable memory an erase step is involved prior to re-programming a memory cell. Two typical flash memory cells are shown in FIGS. 1 and 2. FIG. 1 is a stacked gate flash having a dual gate 10, one of the gates being a floating gate for storing electrons. A drain 14 and source 16 are formed in a well or substrate to define the transistor-like structure of the memory cell. FIG. 2 shows a structure 20 in which the gate 29 is separated from the well or substrate by a nitride layer for storing electrons. Again the memory cell includes a drain 24 and source 26.

One approach to programming the flash memory cell such as the cells of FIGS. 1 and 2 involves injecting electrons into the storage layer 12, 29 by Fowler-Nordheim tunneling. In another approach, channel-hot-electron (CHE) programming techniques are used to impose an electron charge on the storage layer, in which a high gate voltage, e.g., 8-12 V is applied to the control gate 19 in FIG. 1 or the gate 29 in FIG. 2, while a lower voltage, e.g., 4-6V is applied to the drain 14, 24.

The erasing of the memory cells, in turn, involves the removal of electrons from the storage layer or the addition of holes. One technique is known as band-to-band induced hot hole (BBHH) injection in which a negative voltage, e.g., −3 to −8 V is applied to the control gate 19 or gate 29 while a positive voltage of 4 to 8V is applied to the drain 14, 24.

It will be appreciated that in both the program and the erase phases, a substantial amount of current is needed. This therefore limits the number of parallel memory cells that can be programmed in any one step.

A further problem arises from the fact that not all memory cells can be programmed by applying the same voltage across the gate and drain. Manufacturing variations will invariably cause substantial differences in the voltage required to program or erase the various memory cells in a non-volatile memory array. For example, it is normal to find that some cells in a memory array can be programmed at an applied drain voltage of as low as 3V. Others will not be programmed until a voltage of 6.5-7 V is applied. Therefore, in order to ensure proper programming and erasing of all memory cells the cell with weakest attributes, e.g. for programming purposes, the cell that requires the greatest drain voltage dictates the voltage that has to be generated. For example if a current of 300 μA is needed for each memory cell and the weakest cell requires a drain voltage of 6.5V to be effectively programmed, the charge pump for a 4-bit simultaneously programmed flash array needs to be capable of generating 1.2 mA at 6.5 V in order to deal with the worst case scenario. The programming voltage is also a function of the supply voltage $V_{cc}$ and temperature, thus low $V_{cc}$ and high temperature tend to require higher programming voltages.

Clearly, that process can be time consuming and cumbersome. The present invention seeks to provide a more efficient approach to programming and erasing non-volatile memory cells.

SUMMARY

A method of processing an array of non-volatile memory cells to program or erase the same, by applying a voltage to the same through a program and verify pulse application circuit. The process includes a first step of selecting a voltage to be applied. Then, the maximum number of memory cells that can be processed simultaneously is determined, based on the selected voltage and characteristics of the memory cells and the circuit. The array is divided into processing groups, each group having a number of cells less than or equal to the maximum determined number. Finally, the voltage is applied to the cells.

BRIEF DESCRIPTION OF THE DRAWINGS

FIGS. 5*a*-5*g* depict the program sequence of the prior art method shown in FIG. 4.

FIGS. 9*a*-9*d* set out the program sequence for the embodiment of the claimed invention shown in FIG. 7*a*.

DETAILED DESCRIPTION

Figure 1:
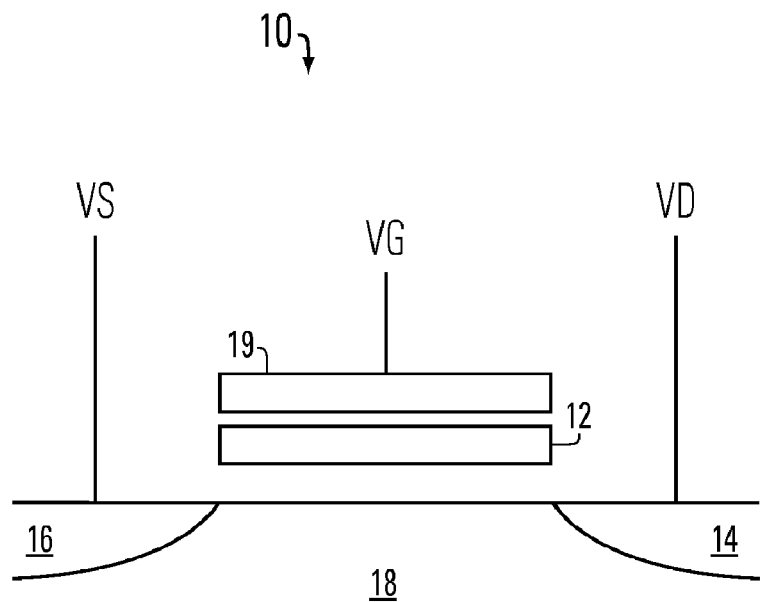
FIG. 1 is a section through one type of prior art flash memory cell.
Figure 2:
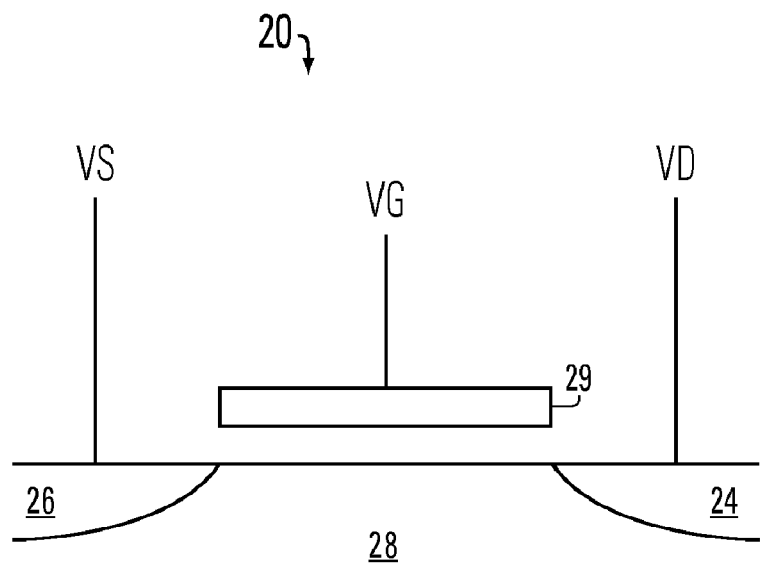
FIG. 2 is a section through another type of prior art flash memory cell.
Figure 3A:
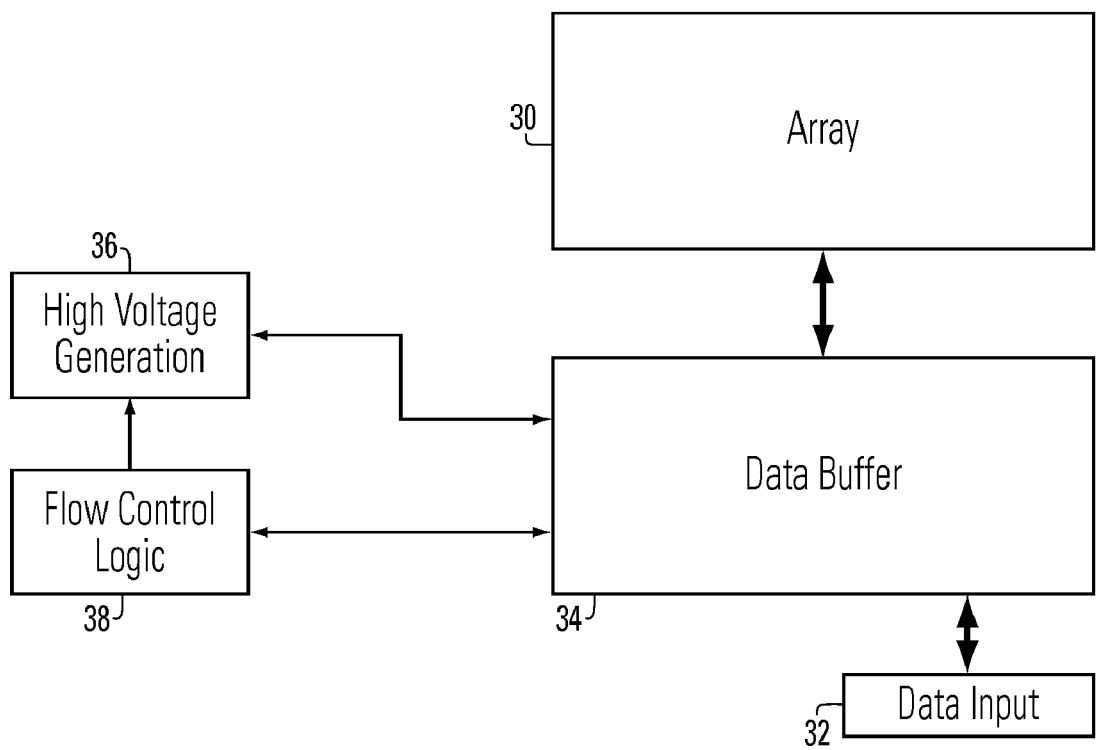
FIGS. 3*a* and 3*b* are block diagrams of a prior art non-volatile memory array device.

In order to better understand the system involved in programming and erasing memory cells in a non-volatile memory array, it will be helpful to understand in some detail the method adopted by the prior art, a simplified prior art block diagram of which is shown in FIG. 3*a*. The memory array 30 is programmed using data from a data input 32. A data buffer 34 stores input data from the data input 32 and then makes use of a data-line driver to drive high voltage onto the bit-lines based on the input data. The data buffer also includes a sense amplifier to check whether bits have passed program verify. Once program verify has been passed the data buffer 34 clears those bits. In the case where a large number of bits needs to be programmed, the bit-lines are divided into groups and programming proceeds with one group at a time.

Flow control logic 38 controls when the data buffer 34 needs to turn on the data-line driver to drive the high voltage onto the bit lines. It also controls when the sense amplifier turns on to check whether the bits passed program verify.

High voltage generation module 36 provides the voltage ($V_d$) required to program the data elements. That module is shown in greater detail in FIG. 3b, where it can be seen that the module includes a charge pump 31 and a drain regulator 33. The voltage actually generated by the charge pump, $V_{pp}$, depends on the applied load, as known in the art and as discussed in more detail below. The drain regulator ensures that the voltage $V_d$ delivered at output 37 is at a selected level. This figure also notes control signals ENPUMP and PGMVD applied by the flow control logic module to the charge pump and drain regulator, respectively.

One prior art approach for applying the device discussed above is illustrated schematically in FIG. 4. This method, known as bitline stepping, starts by applying a relatively low programming voltage to a defined number of memory cells simultaneously; then it checks the number of successfully programmed memory cells, and if any are not successfully programmed, it steps up the programming voltage iteratively until all memory cells are programmed. In accordance with this approach, a low bit-line voltage e.g., 4.0V is first applied to a plurality of cells that need to be programmed. This involves applying the programming voltage to the drains of the memory cells via the bit lines using a data line driver in the data buffer 34. Thereafter the programming of the cells is verified using a sense amplifier in the data buffer 34 to determine which memory cells have been successfully programmed. A second higher voltage, e.g. 4.5 V is then applied to the cells that failed the first time. This process is repeated with ever increasing or stepped up programming voltage until all of the memory cells have passed verify.

Assuming that the array does not pass a pre-verify step 39, a first voltage is applied to a predefined number of memory cells in step 40, followed by a verification step 42 to determine which memory cells have not been successfully programmed. If any of the memory cells has not been successfully programmed the programming voltage is stepped up by a delta amount in step 44. This is performed every time a determination is made that not all of the memory cells have passed verification until all memory cells have been programmed.

In order to improve the program and erase performance over the prior art, a bit count determining algorithm is applied in which the number of bitlines or memory cells that can be simultaneously programmed is determined depending on the load presented to the programming voltage generating device. This will be discussed with respect to the programming function but also applies to the erase function as is discussed later in the specification.

Figure 3B:
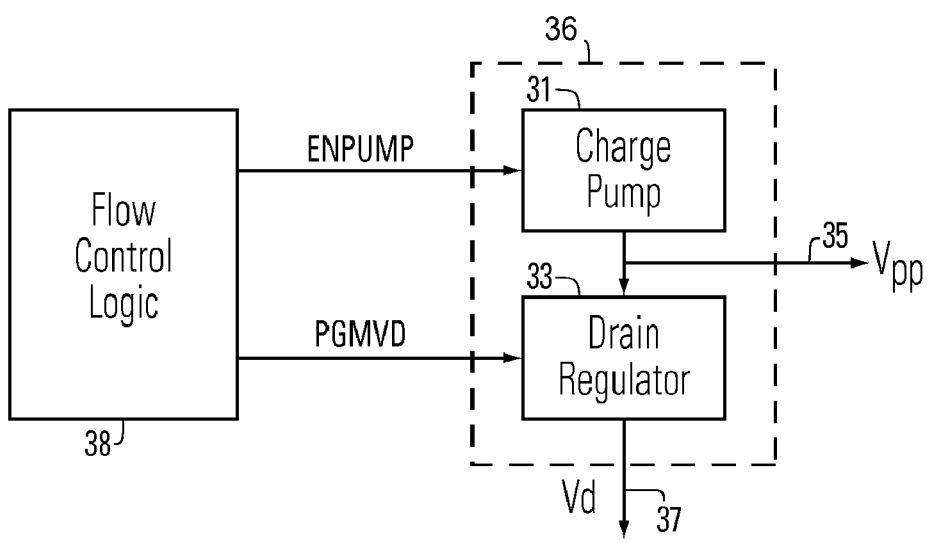
Figure 4:
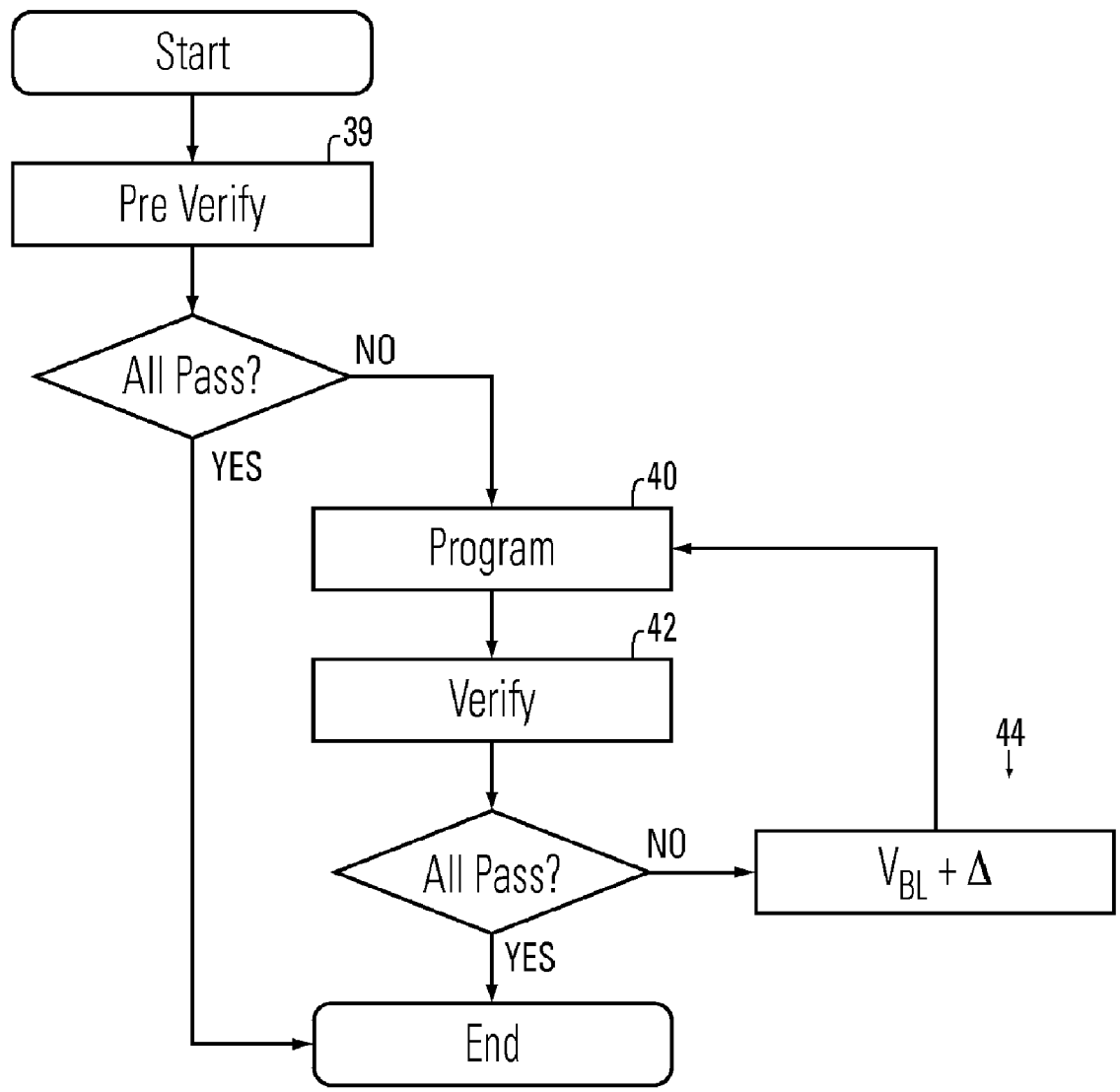
FIG. 4 is a flow chart showing the programming logic in a prior art bitline voltage stepping arrangement.
Figure 5A:
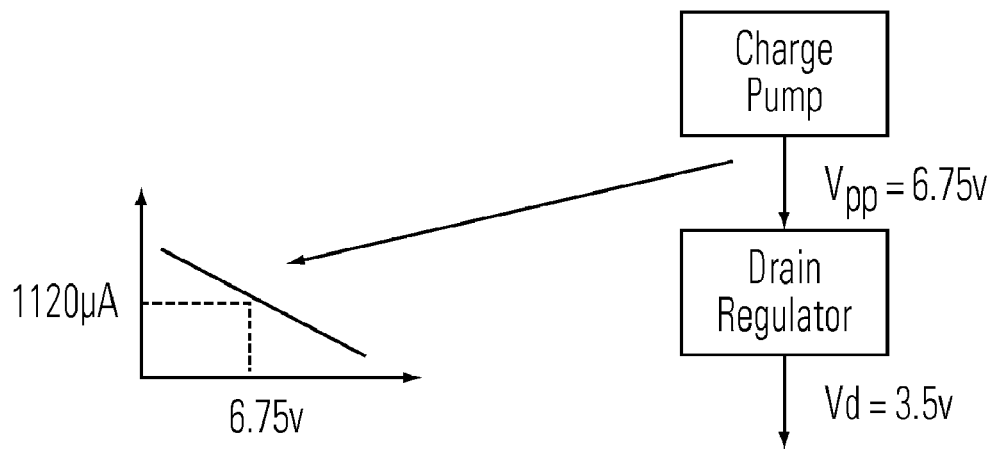
Figure 5B:
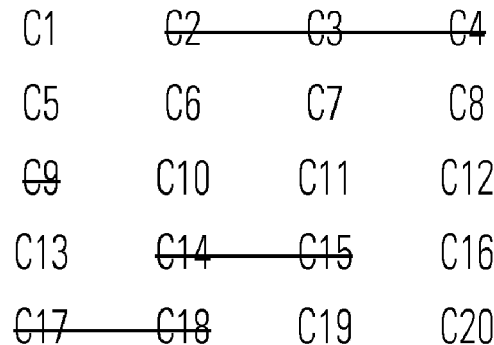

It will be helpful to consider exactly how the device shown in FIGS. 3a and 3b, following the process of FIG. 4, operates to program memory elements, following the example set out in FIGS. 5a-5g. The example requires that an array of 20 elements, C1-C20, be programmed. As noted above, manufacturing and material variations lead to differences in the actual voltage at which these elements will be programmed, as shown in the box at the lower left corner of FIG. 5a. There, a typical distribution is shown, with 8 cells responding at $V_d$=3.5v, and so on. Also typically, it is decided that four elements will be addressed with each programming pulse. Thus, as shown, C1-C4 receive the first pulse, chosen at 3.5v. At that voltage it is known that each cell will draw 280 µA, so that each pulse will require 1120 µA. That current in turn required a charge pump voltage $V_{pp}$ of 6.75v, shown on the array load line. A total of five pulses are required for the first stage. FIG. 5b shows the result of the first pulse, with eight cells programmed.

Figure 5C:
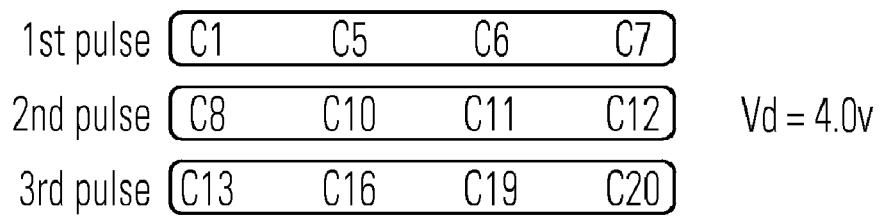
Figure 5C:
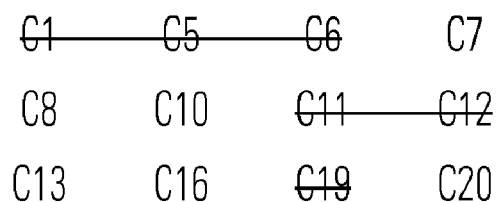

FIG. 5c illustrates the second programming stage, with the remaining twelve cells grouped into three groups and the voltage stepped to $V_d$=4.0v, calling for a pulse current of 1140 µA. Three pulses are required for this stage, and verification shows that a further six cells were programmed in the second stage. Two pulses were required for this stage.

The third stage, shown in FIG. 5d, addresses six cells, in two pulses, at a voltage of $V_d$=4.5v, at a current of 1160 µA. One cell is programmed at this stage.

Likewise, the fourth stage, shown in FIG. 5e, shows five cells programmed in two pulses of 5.0v, resulting in an additional cell being verified.

The fifth and sixth stages, shown in FIG. 5f, have no result, with pulses of 5.5v and 6.0v applied to the remaining four cells, with none being verified. Finally, at the seventh stage, at $V_d$=6.5v, the final four cells are verified as programmed.

FIG. 5g summarizes the prior art bitline stepping process. As shown, the process begins at $V_d$=3.5v and increases $V_d$ by 0.5v per step until the verification steps shows all cells pass. In the typical result seen here, that process required 17 pulses to perform.

Figure 6A:
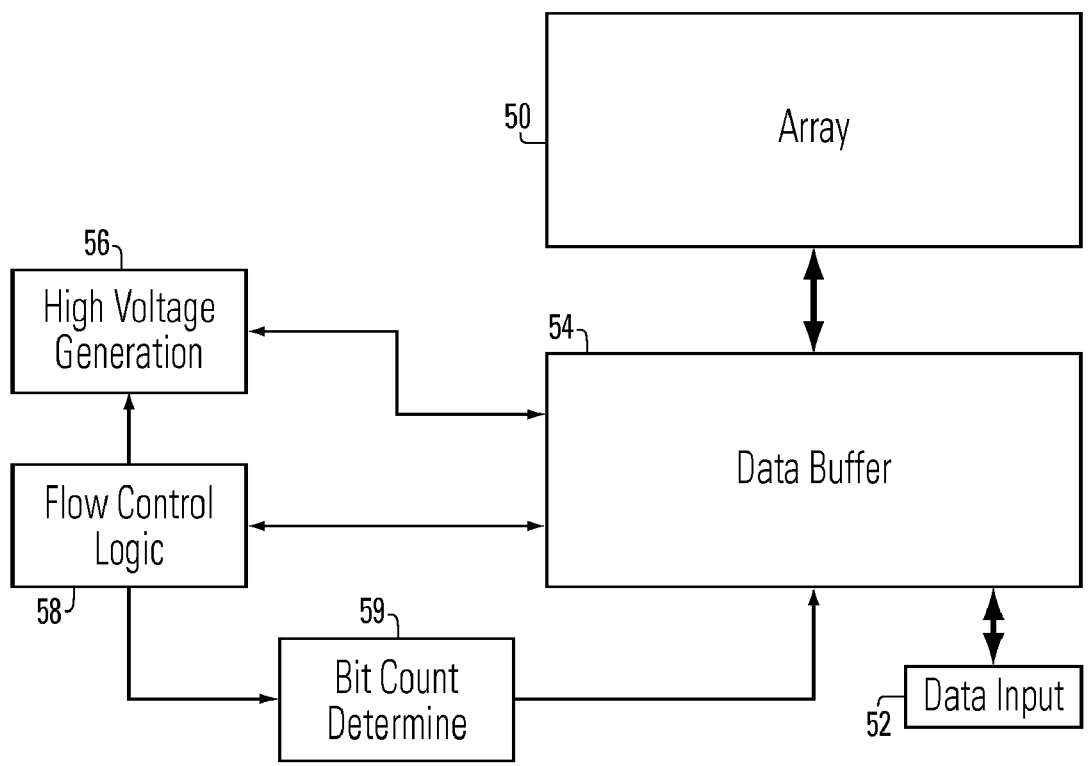
FIGS. 6*a*, 6*b* and 6*c* illustrate an embodiment of the claimed invention.
Figure 6B:
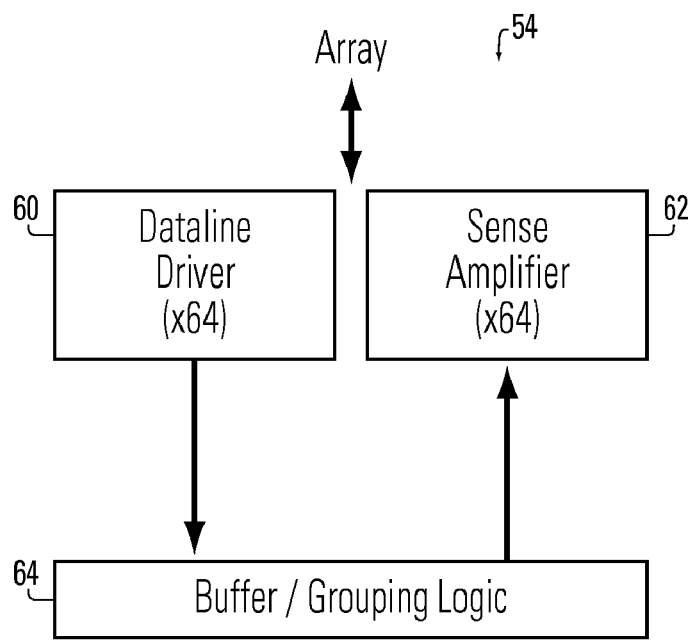

An embodiment of the claimed invention, shown in FIG. 6a, includes a number of the elements to the prior art system of FIG. 3. Thus, this embodiment includes a memory array 50, a data input 52 for providing the data, a data buffer 54, a high voltage generator 56, which includes a charge pump as previously discussed, and a flow control logic block 58 to control the data buffer 54. The data buffer 54 is shown in greater detail in FIG. 6b, showing the data line driver 60 and sense amplifier 64, which in this embodiment are adapted to accommodate 64 bits in parallel driver, thereby allowing 64 memory cells to be programmed simultaneously, assuming no limitation on the high voltage capability. In addition, there is provided a buffer/grouping logic block 64. This block stores inputted data and determines how the bits are to be grouped. It also clears all bits that have passed verify based on the sense amplifier data output. This element, as shown below, allows the implementation of variable bit programming.

In addition, FIG. 6a also shows a bit count determining block 59. This element receives control signals from flow control logic element 58, from which it determines the number of memory cells or bits to be programmed simultaneously, as discussed below.

Figure 6C:
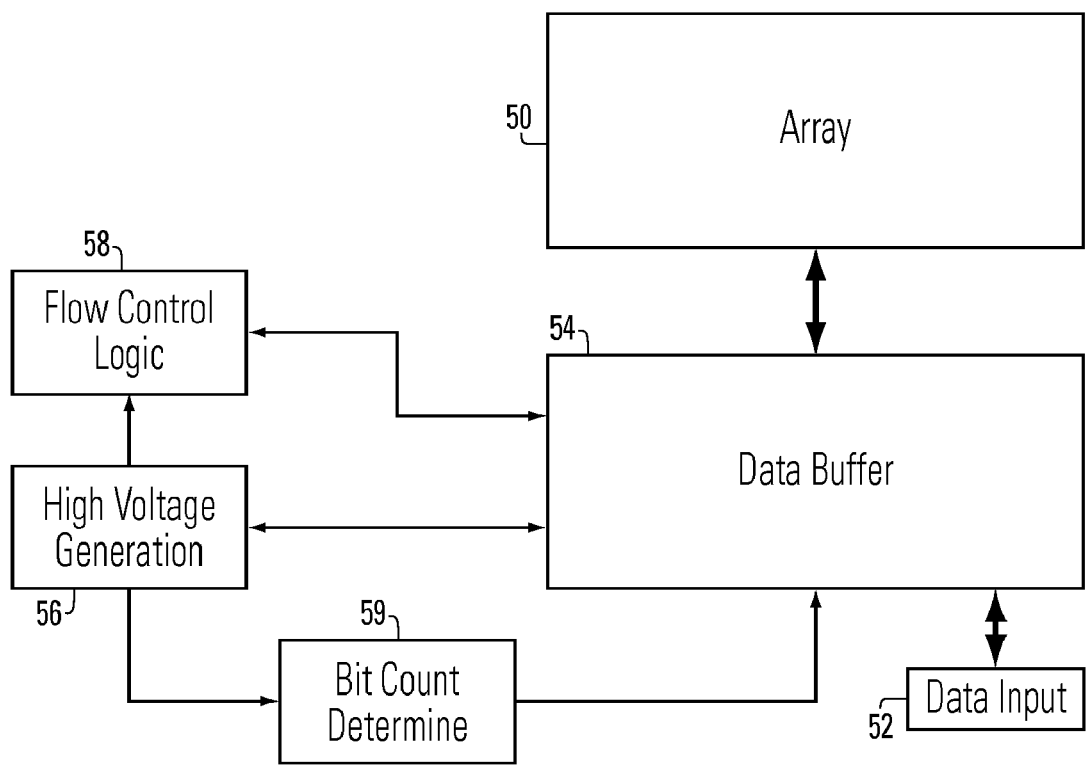

FIG. 6c depicts another embodiment of the claimed invention, in which the bit count determining block 59 receives input from the high-voltage generation block 56 rather than the flow control logic block 58. Operation of this embodiment is discussed in detail below.

In general, an important aspect of the claimed invention relates to the ability to vary the number of cells being programmed simultaneously. The number of parallel cells that can be programmed simultaneously depends on the current that can be delivered by the supply element at a given voltage. The claimed invention at takes advantage of the ability of the charge pump to deliver higher current at lower voltage levels, which allows for a greater number of cells to be included in each parallel grouping at lower voltage levels. A key step of the present invention is thus the determination of the number of cells to group together for a given programming pulse, performed by bit count determining block 59.

Figure 7A:
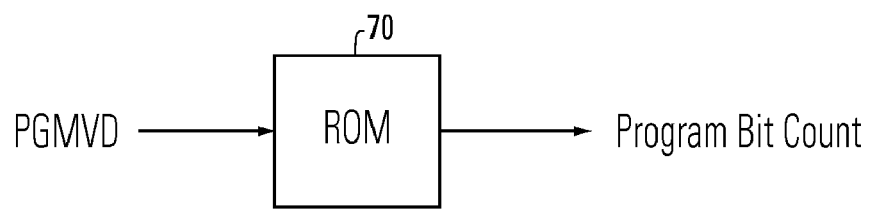
FIGS. 7*a* and 7*b* are block diagrams of embodiments of a bit count determining block of the claimed invention.
Figure 8A:
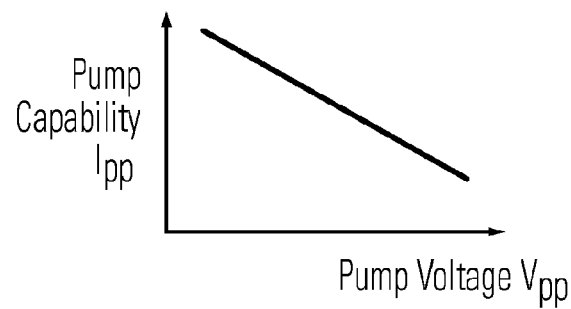
FIGS. 8*a*-8*d* illustrate the operation of the embodiment illustrated in FIG. 7*a*.
Figure 8B:
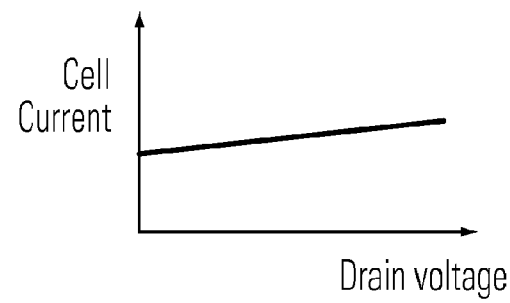
Figure 8C:
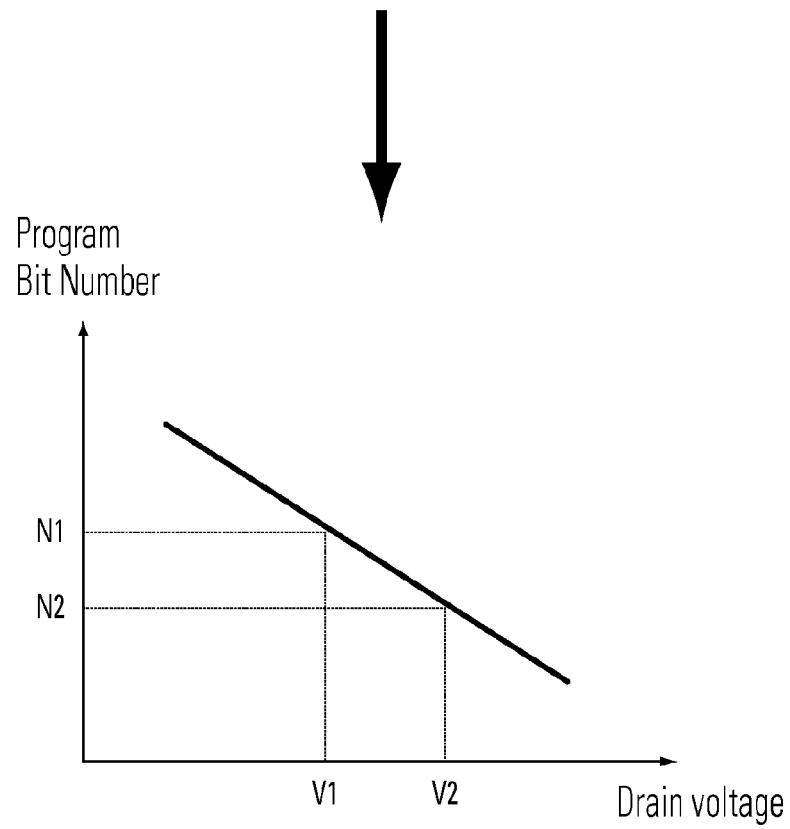

A number of embodiments can be employed to implement the logic of bit count determining block 59 of FIGS. 6a and 6c. A first embodiment, shown in FIG. 7a, is a Read Only Memory (ROM), which can be implemented in a chip. The basis for this embodiment is shown in FIGS. 8a-8c, where FIG. 8a shows the inverse relationship between charge pump voltage and pump capability—that is, the number of cells that can be programmed at a given voltage, as discussed above. That data for a given application can be combined with individual cell voltage/current relationship curve shown in FIG. 8b, to produce the system load line shown in FIG. 8c, which relates the number of cells that can be programmed to a given supply voltage. The detailed calculations required to produce the load line of FIG. 8c are well within the capabilities of those in the art.

Figure 8D:
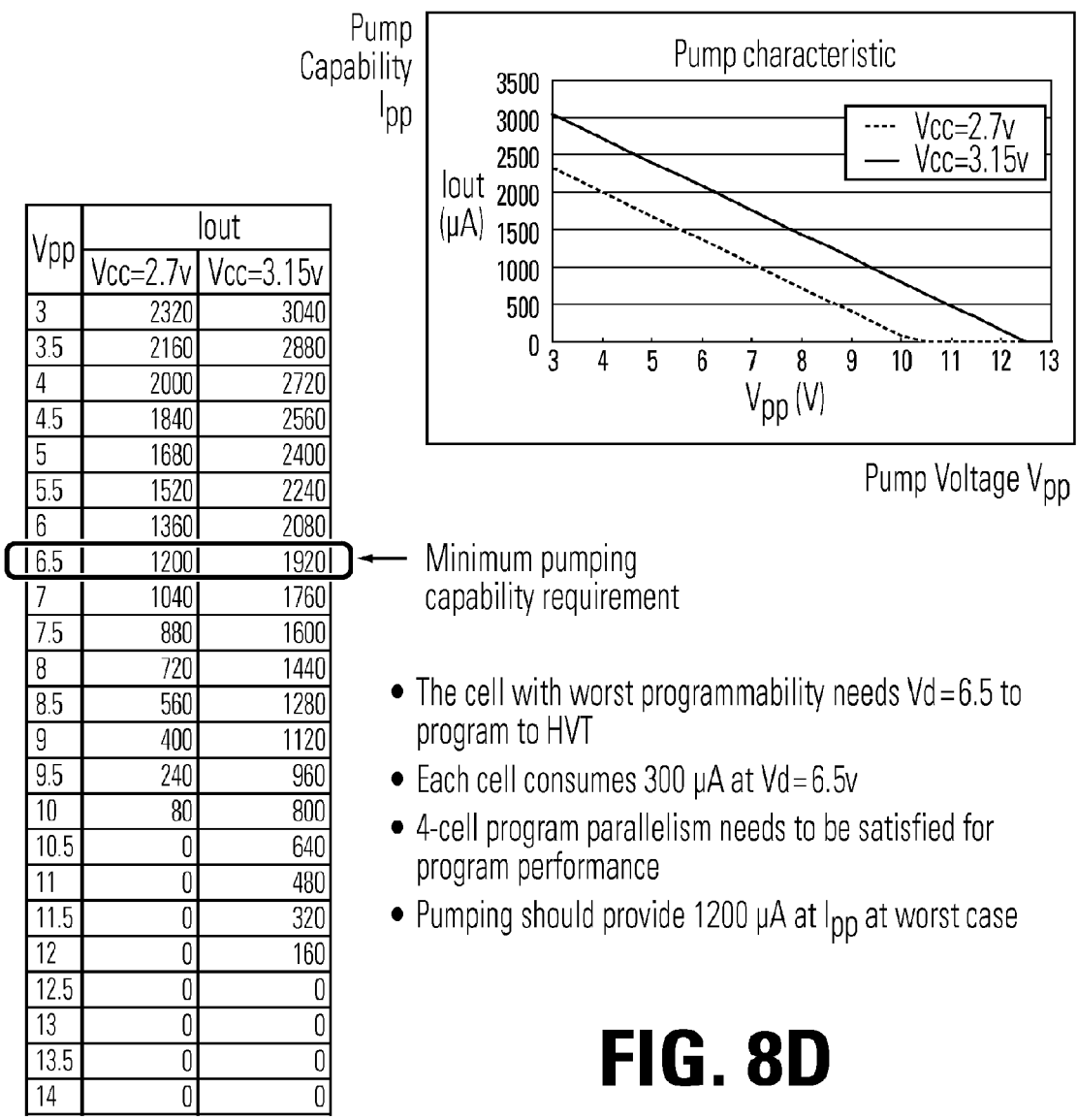

Several design choices must be made in constructing this embodiment, as shown in FIG. 8d. First, a voltage must be selected that represents the worst programming case—the voltage required to program the worst cells. Here, that voltage is chosen as $V_d$=6.5v. Then, a minimum number of cells to be programmed in parallel must be selected, which in the example shown is 4. With those choices, and knowing that a cell draws 300 μA at $V_d$=6.5v, the worst case pumping capacity of 1200 μA at $V_d$=6.5v is calculated. Employing standard design techniques, the system is designed and the load line data set out as shown in FIG. 8d.

Those of skill in the art will understand the optimum methods of configuring a ROM to provide the information needed, given the data related to the properties of the memory cells. One embodiment employs a simple lookup table, so that one can enter the desired voltage and receive the corresponding number of cells that can be programmed in parallel. Another embodiment employs a hard-wired circuit that accomplishes the same result.

Figures 9A, 9B:
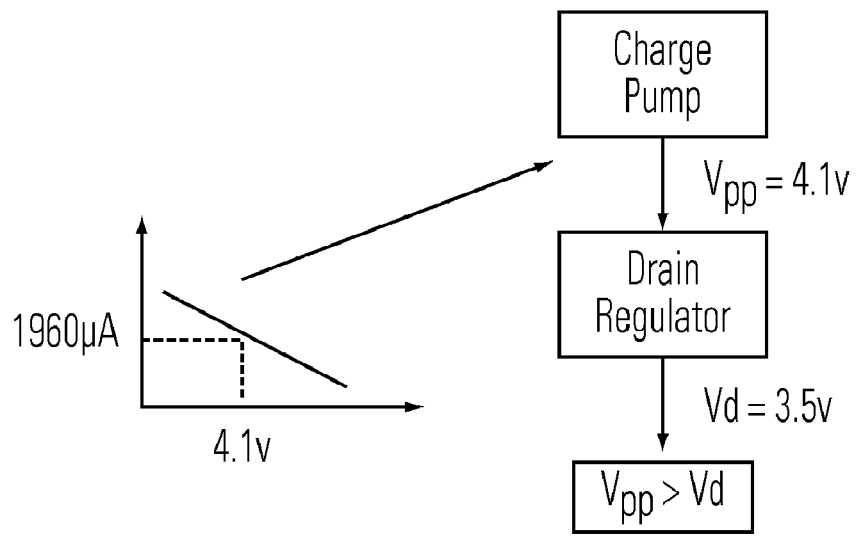

FIG. 9a-9c applies the embodiment of FIG. 7a to the problem of programming an array of 20 cells, replicating the situation presented in connection with FIGS. 5a-5g. Starting at $V_d$=3.5v, as previously done, one can use the fact that a single cell draws 280 μA at that voltage, together with the pump output current capability from FIG. 8d, to see that this embodiment can program 7 cells simultaneously at that voltage. Note that at this loading the pump voltage $V_{pp}$ is only 4.1v, but that level maintains the criterion that $V_{pp}$ must be greater than $V_d$. With the ability to program seven cells in parallel, the first stage requires only three pulses.

This exercise assumes that exactly the same cells will be successfully programmed at the same voltages as shown earlier, resulting in eight cells verified during the first pulse, leaving twelve cells for the second pulse, as seen in FIG. 9b. Again, seven cells are programmed in parallel, with a second stage voltage Vd=4.0v, with another six cells verified. For the third stage, at $V_d$=4.5v, the system can only program six cells in parallel, but that takes in all remaining cells, so this stage is handled in a single pulse.

FIG. 9c depicts the remaining stages, in which five cells are programmed in the 4$^{th}$ stage, at $V_d$=5.0v, with one verified, and no cells are verified in the following two stages ($V_d$=5.5v and 6.0v, respectively). Finally, the final four cells are verified after programming at $V_d$=6.5v, in step 7.

The method of the claimed invention is summarized in FIG. 9d. As seen, this process requires only 11 pulses, not the 17 required by the prior art system.

Figure 7B:
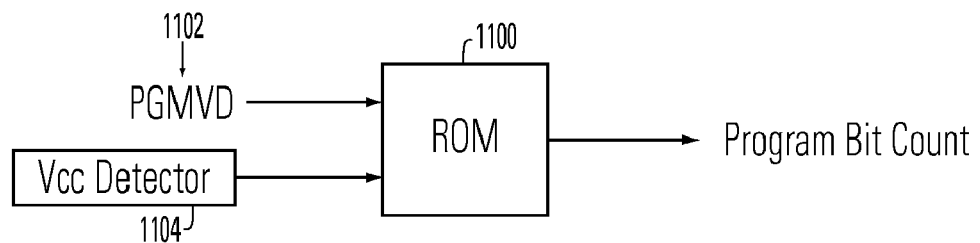
Figure 10A:
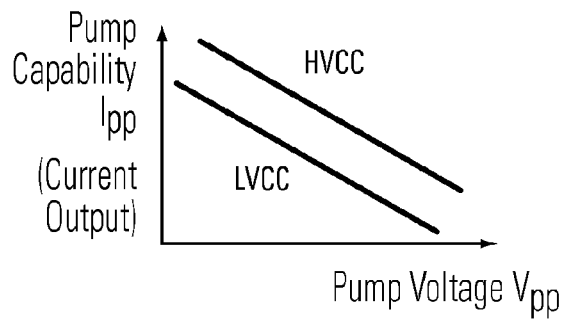
FIGS. 10*a*-10*c* illustrate the operation of the embodiment illustrated in FIG. 7*b*.
Figure 10B:
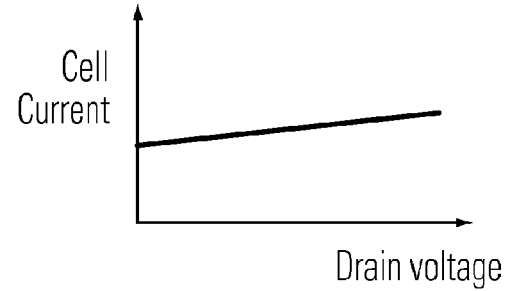
Figure 10C:
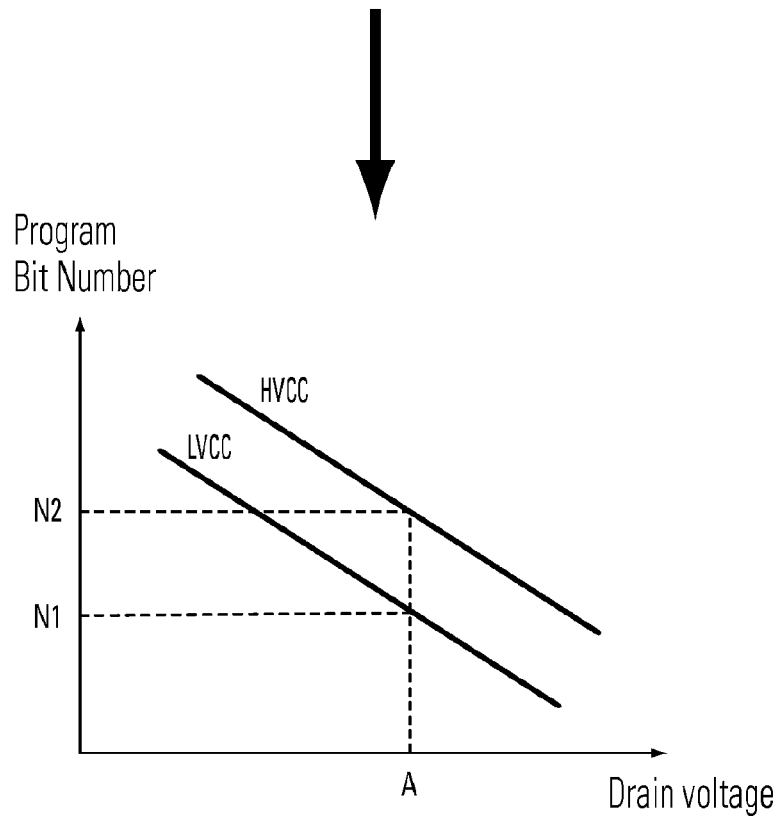

Another embodiment of the bit count determining block 59, shown in FIG. 7b, provides ROM 1100 not only with program voltage 1102 as an input but also takes into account $V_{cc}$. Since the pump capabilities vary with changing $V_{cc}$, monitoring changes in $V_{cc}$ allows a more accurate determination to be made of the number of memory cells to be programmed simultaneously. That fact is illustrated in FIGS. 10a-10c, where one starts with same cell characteristic curve in FIG. 10a, but one finds that changes in $V_{cc}$ shift the entire curve, as seen in FIG. 10b, providing increased pump capability with increased $V_{cc}$. Thus, as shown in FIG. 10c, if one programs cells at $V_d$=A, then the number of cells that can be handled in parallel varies from N1 to N2, depending on $V_{cc}$. The $V_{cc}$ detector takes advantage of that fact by determining the actual level of $V_{cc}$ and feeding that value into the ROM as a further input, resulting in the system addressing the number of cells that is closer to the real pump capability.

Figure 11A:
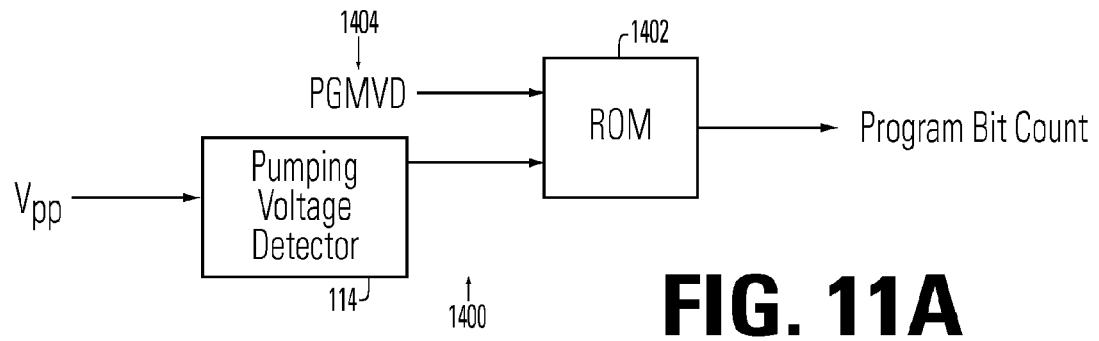
FIGS. 11*a* and 11*b* are block diagrams of further embodiments of a bit count determining block of the claimed invention.
Figure 12:
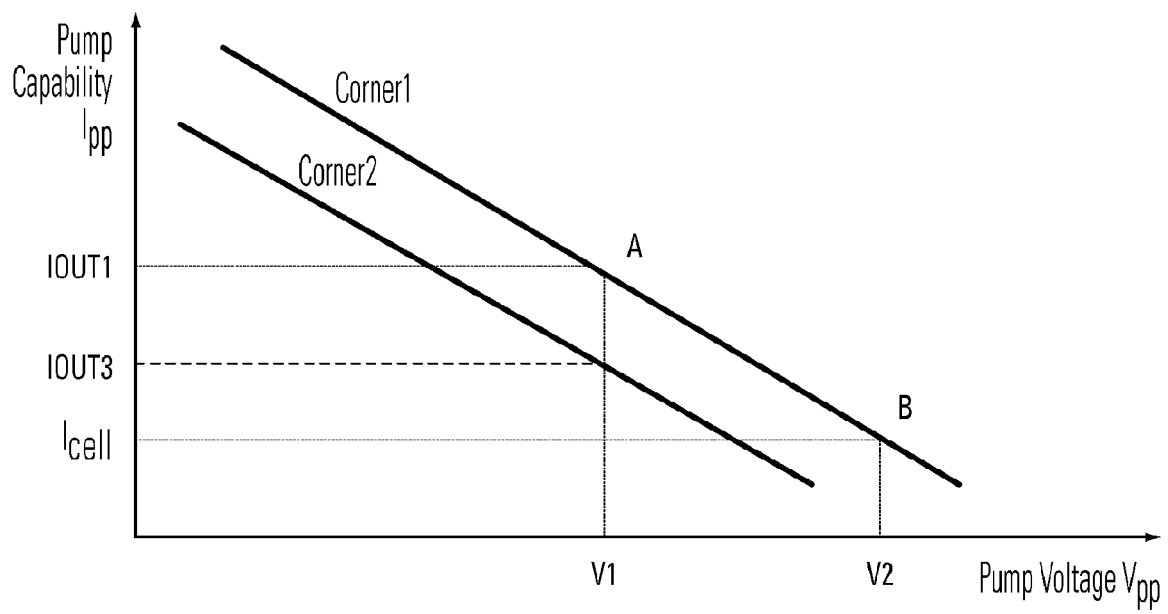
FIG. 12 shows charge pump current vs. output voltage curves for a charge pump used in the embodiment of FIG. 11*a*.

Yet another embodiment of a bit count determining block 59 is shown in FIG. 11a, which includes a charge pump output voltage signal $V_{pp}$ 1400 as a second input to the ROM 1402, in addition to the program voltage 1404 input. The charge pump output voltage is determined by detecting the pump out voltage $V_{pp}$ (see FIG. 3b). Thus instead of assuming that the pump is providing the ideal pump voltage to program the memory cells, the initial programming of a memory cell at a known pump current $I_{cell}$ is compared to the actual pump output voltage. As seen in FIG. 12, if the programming voltage of the single cell is V1, instead of simply assuming that this is also the output voltage capability of the pump and using the lower load curve Corner 2 to arrive at a total potential current of Iout3, the present embodiment measures actual output voltage of the pump. If this is V2 then the load curve is given by Corner 1 and at the much lower programming voltage of V1 a much higher total current of $I_{out1}$ can be provided.

Figure 13:
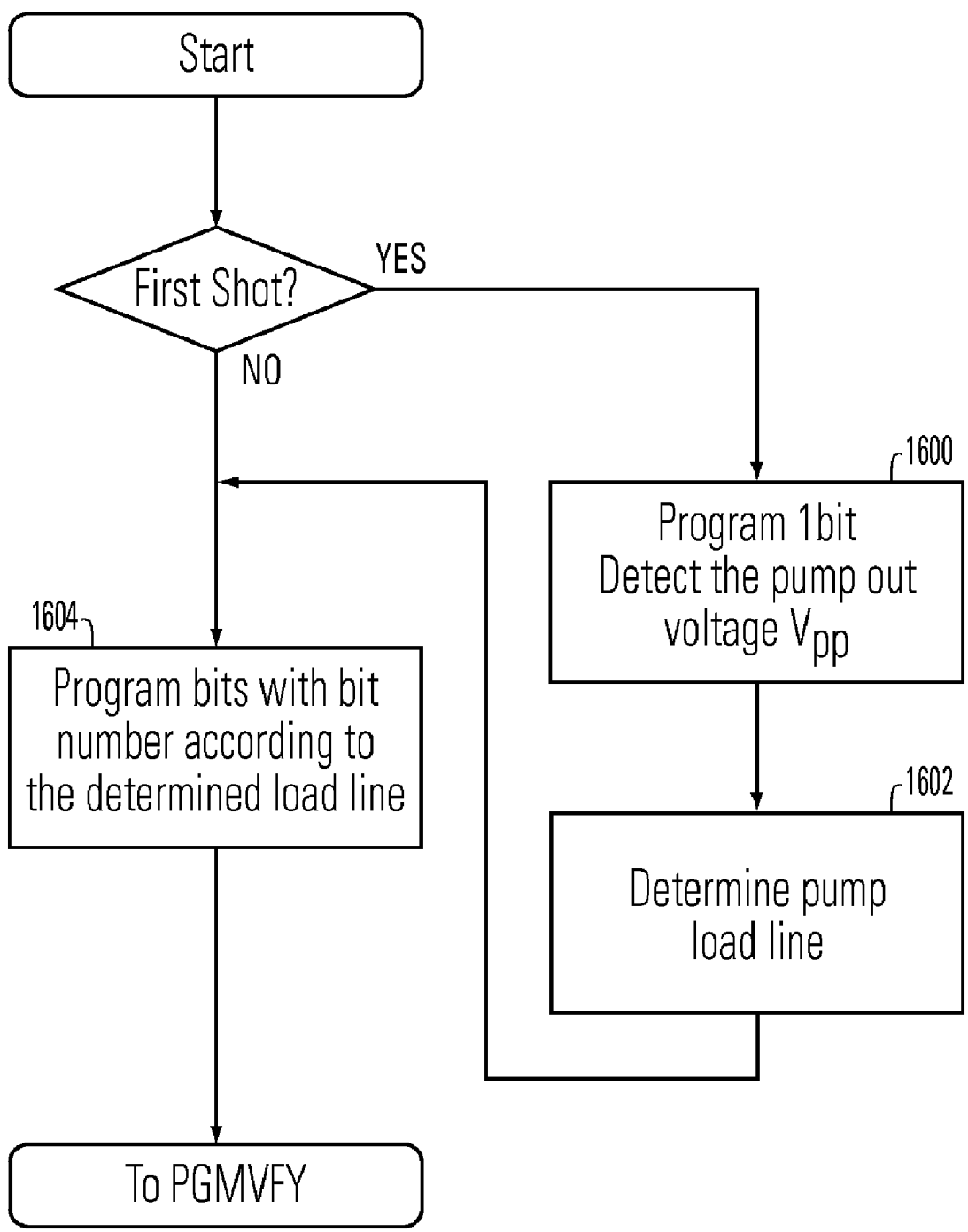
FIG. 13 is a flow chart showing the operation of the embodiment shown in FIG. 11*b*.

A flow chart of the steps involved in selecting the proper FIG. 12 load line is shown in FIG. 13. At the start of the first stage of programming (the initial steps of block 40, FIG. 4), the system runs a test by programming a single memory cell (1 bit) in step 1600. For example, for a single cell program current of 280 μA, the test run 1602 programs single cell only so that $V_{pp}$ would be 9.38v (FIG. 8d interpolation to $V_{pp}$=9.38v/I=280 μA) under Corner 2 (FIG. 12) and $V_{pp}$ would be 11.63v (FIG. 8d $V_{pp}$=11.63v/I=280 μA) under Corner 1. The detector 114 in FIG. 11a can detect whether $V_{pp}$ is larger than 11.63v, and thus the system can determine whether the pump is providing the high or low level of voltage, and thus the correct lookup table can be used. Once that is known, the system can follow the steps in FIG. 9a~9d and determine the bit count by either the $V_{cc}$=3.15v line in FIG. 8d, or if $V_{pp}$<11.63v the system can employ the $V_{cc}$=2.7v line in FIG. 8d. This process takes into account the actual pump output voltage $V_{pp}$ in determining the pump load line in step 1602. In step 1604 the system returns to the steps outlined above, with the ability to employ more accurate calculations, based on using the load line that more correctly reflects the actual pump output voltage.

Figure 11B:
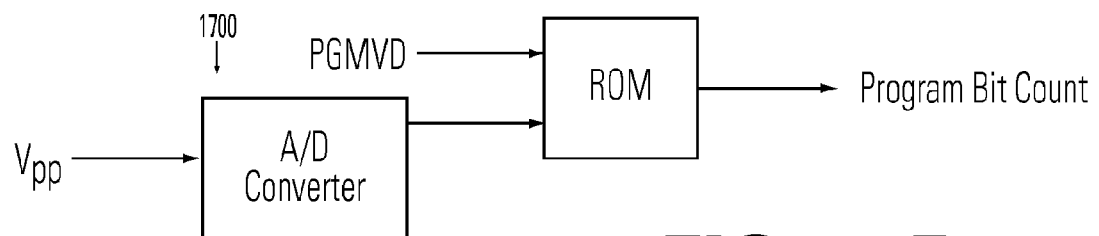

The embodiment of FIG. 11b is similar to that of FIG. 11a except that in this case the $V_{pp}$ voltage from the charge pump is digitized by an A/D converter 1700. This allows the pump load line and program bit count to be more accurately determined.

Although the above description dealt specifically with the programming of memory cells, the techniques are applicable also to the erasing of memory cells in which the number of cells that can be simultaneously erased in parallel is determined by first determining the load provided by a single memory cell and then erasing the number of cells simultaneously as will be supported by the charge pump at a given voltage.

Moreover, those of skill in the art will further understand that a number of modifications and variations can be implemented, all within the spirit of the invention, which is defined solely by the claims appended hereto. For example, more elaborate calculation means could be provided for determining the optimum number of cells included in each pulse, should that become desirable. If one could implement a charge pump having a greatly increased capacity, for example, it would become desirable to calculate the number of cells that could be handed, rather than depending on a look-up table. Modifications of that sort fall clearly within the ambit of the invention.

What is claimed is:

1. A method of operating a memory comprising a plurality of memory cells, comprising the steps of:
    applying a voltage to the memory;
    determining a number of memory cells that can be processed simultaneously based on the applied voltage;
    grouping the memory cells into processing groups, each group having a number of cells less than or equal to the determined number; and
    operating the memory based on the processing groups.

2. The method of claim 1, further including verifying which memory cells of the plurality were successfully processed after applying the voltage.

3. The method of claim 2, further including the step of iteratively continuing the applying, determining, grouping, operating and verifying steps until the plurality of memory cells is successfully processed.

4. The method of claim 1, wherein the voltage is generated by a charge pump.

5. The method of claim 1, further including the step of detecting the power supply voltage Vcc and taking the detected Vcc value into account in determining the number of memory cells in said groups.

6. The method of claim 5, further including the step of determining the output voltage of the charge pump and using the same in determining the number of memory cells in said groups.

7. The method of claim 2, wherein said operating comprises programming or erasing memory cells in the plurality of memory cells, and the step of verifying includes identifying unprogrammed or unerased memory cells in a processing group after applying the voltage to the processing group.

8. A method of operating a memory comprising a plurality of memory cells, comprising the steps of:
    grouping the plurality of cells into a plurality of first level groups, the first level groups including at most a first number of memory cells and at least one of the first level groups including the first number of memory cells, the first number being a pre-determined number of cells that can be programmed or erased in parallel with current from a voltage source at a first level bias voltage, the first level bias voltage having a first magnitude;
    applying the first level bias voltage from the voltage source in parallel to members of each first level group in the plurality of first level groups for programming or erasing memory cells in each first level group;
    verifying the programming or erasing of the plurality of first level groups to identify memory cells in the plurality which were not successfully processed after applying the first level bias voltage;
    grouping memory cells that were not successfully processed by applying the first level bias voltage into a plurality of second level groups, the second level groups including at most a second number of memory cells and at least one of the second level groups including the second number of memory cells, the second number being a pre-determined number of cells that can be programmed or erased in parallel with current from the voltage source at a second level bias voltage, the second level bias voltage having a magnitude greater the first level bias voltage;
    applying the second level bias voltage from the voltage source in parallel to members of each second level group in the plurality of second level groups for programming or erasing memory cells in each second level group.

9. The method of claim 8, wherein the voltage source comprises a charge pump.

10. The method of claim 9, further including determining an output voltage of the charge pump and taking the output voltage into account in determining the pre-determined number of memory cells that can be programmed or erased in parallel with current from the voltage source at the first level bias voltage.

11. The method of claim 8, further including the step of detecting the power supply voltage Vcc and taking the detected Vcc value into account in determining the pre-determined number of memory cells that can be programmed or erased in parallel with current from the voltage source at the first level bias voltage.

12. A memory device, comprising:
    a plurality of memory cells in a memory array;
    a controller for applying varying bias voltages to the memory array; and
    a bit count determining circuit coupled to the memory array, which determines a number of memory cells that can be processed simultaneously based on the bias voltage applied to the memory array.

13. The memory device of claim 12, including a voltage source which generates an output voltage and including a circuit responsive to the output voltage to produce the voltage applied to the memory array, the voltage source being capable of producing less current at higher output voltages, and the bit count determining circuit determining different numbers of memory cells that can be processed simultaneously for different bias voltages.

* * * * *